United States Patent [19]
Clemens

[11] Patent Number: 5,660,644
[45] Date of Patent: Aug. 26, 1997

[54] PHOTOVOLTAIC CONCENTRATOR SYSTEM

[75] Inventor: Donald D. Clemens, Thousand Oaks, Calif.

[73] Assignee: Rockwell International Corporation, Seal Beach, Calif.

[21] Appl. No.: 491,822

[22] Filed: Jun. 19, 1995

[51] Int. Cl.$^6$ .................. H01L 31/045; H01L 31/052
[52] U.S. Cl. .................. 136/245; 136/246; 136/259
[58] Field of Search .................. 136/245, 246, 136/259

[56] References Cited

U.S. PATENT DOCUMENTS

| 4,282,394 | 8/1981 | Lackey et al. ............. 136/245 |
| 5,154,777 | 10/1992 | Blackmon et al. ........... 136/245 |

OTHER PUBLICATIONS

"Flight Experiment For Large Inflatable Parabolic Reflector," Mitchell Thomas, 1993, pp. 361–368, American Society of Mechanical Engineers, New York, NY.

"Application Of A Parabolic Trough Concentrator To Space Station Power Needs," Theodore G. Stern and Paul A. Kominski, Aug. 18–23, 1985, pp. 1.37–1.42, Society of Automotive Engineers, Warrendale, PA.

"Design & Development Of A Line–Focus Refractive Concentrator Array For Space," Michael F. Piszczor, Mark J. O'Neill, and Lewis M. Fraas, Aug. 7–11, 1994, pp. 282–287, AIAA-94-4239-CP, 29th Intersociety Energy Conversion Engineering Conference, Monterey, CA.

*Primary Examiner*—Aaron Weisstuch
*Attorney, Agent, or Firm*—Harry B. Field; Steven E. Kahm

[57] ABSTRACT

A light weight photovoltaic concentrator having a foldable, easily deployed structure for concentrating solar rays on solar cells for generating electricity is disclosed. The photovoltaic concentrator features a concentrator which can be inflated, for ease of deployment, to a shape for reflecting sunlight onto solar cells. The solar cells are protected from overheating by a protective infrared coating and by being attached to a heat pipe with a fin for radiating excess heat. The inflatable concentrator is inflated by gas stored in the central arm which supports one end of the concentrator. The concentrator is inflated until the epicenters of the front and rear surfaces reach a specified distance and the concentrator is thereafter maintained at this position by addition of additional gas as needed to compensate for leakage. The concentrator may have a means of stiffening the inflated reflective surface by chemical changes activated after the concentrator is deployed. The concentrator may also be made of a more rigid material rather than be inflatable.

10 Claims, 4 Drawing Sheets

PHOTOVOLTAIC CONCENTRATOR SYSTEM

BACKGROUND OF THE INVENTION

1. Field of the Invention

This invention relates to solar power concentrators and more particularly to foldable, light-weight solar power concentrators for satellites and spacecraft.

2. Description of Related Art

In the past solar cells have been used in space and on Earth to generate electrical current from a light source such as the sun. However solar cells are very expensive. Since the amount of electricity generated by a solar cell is proportional to the amount of light incident on the solar cell methods of concentrating the light on the solar cells have been employed to reduce the number of solar cells. Many means for concentrating sunlight have been used. Large parabolic dish reflectors are common. These however are bulky, heavy, and not foldable, so that they are not readily transportable. The weight and foldablity features are particularly important if the solar collector is to be used in space.

One method of concentrating sunlight proposed for spacecraft is a trough-shaped Fresnel lens. These lenses are heavy and not readily foldable, limiting their desirability, especially for space based operations.

Very large disk parabolic inflatable concentrators to provide energy to a solar rocket have been proposed. Inflatable concentrators are light weight, foldable, easy to deploy structures which are particularly desirable for transportable concentrators such as for use in space.

SUMMARY OF THE INVENTION

A light-weight, foldable, easy to deploy inflatable photovoltaic concentrator is disclosed. The photovoltaic concentrator has a base, a mast which can pivot on the base, and a rod pivotably attached to the mast for supporting a heat pipe. The heat pipe has solar cells attached to one side and a fin for radiating excess heat from the solar cells. The heat pipe also acts as the main structural support for the photovoltaic concentrator. Struts forming a frame are attached to the heat pipe. Arms are attached to the struts for holding a reflector. The reflector is a parabolic trough which focuses sunlight on the solar cells for creating electricity.

Since the reflective surface can be on a light weight inflatable concentrator the photovoltaic concentrator can be launched into space in a small volume and can be easily deployed by unfolding the heat pipe, struts and arms, and then inflating the concentrator.

The inflatable concentrator can be stiffened for uses where stress may be expected during the life of the concentrator. Alternatively, a stronger non inflatable concentrator may be substituted on the frame for terrestrial uses where low weight and ease of deployment are not as critical.

OBJECTS OF THE INVENTION

It is an object of the invention to have a light weight photovoltaic concentrator.

It is a further object to have a compact and easily deployable photovoltaic concentrator.

It is still a further object to concentrate light on solar cells to limit the number of solar cells used in a solar electric generator.

It is an object of the invention to provide a long life photovoltaic generation system by providing an optimum operating temperature range on the solar cells.

It is also an object of the invention to provide an inflatable reflector for one embodiment of the solar reflector.

Other objects, advantages, and novel features of the present invention will become apparent from the following detailed description of the invention when considered in conjunction with the accompanying drawing.

DETAILED DESCRIPTION OF THE PREFERRED EMBODIMENT

Figure 1:
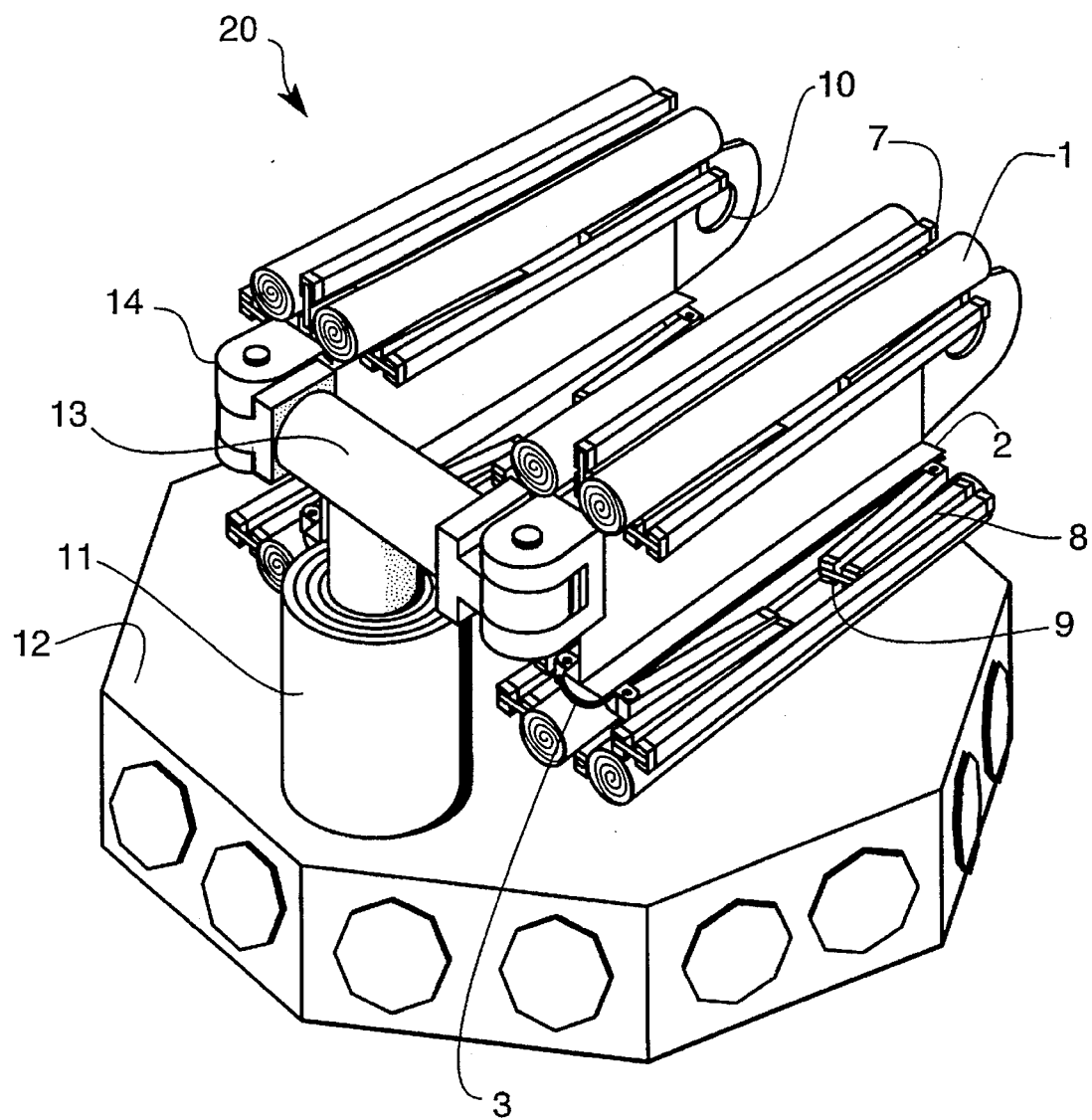
FIG. 1 shows a perspective view of the invention, folded, ready for deployment.

FIG. 1 shows the photovoltaic concentrator, generally shown, as number 20, in its stored condition ready for deployment. In the embodiment shown the photovoltaic concentrator 20 has an inflatable concentrator 1 which is rolled up. The inflatable concentrator 1 will unroll as the photovoltaic concentrator is deployed.

Figure 2:
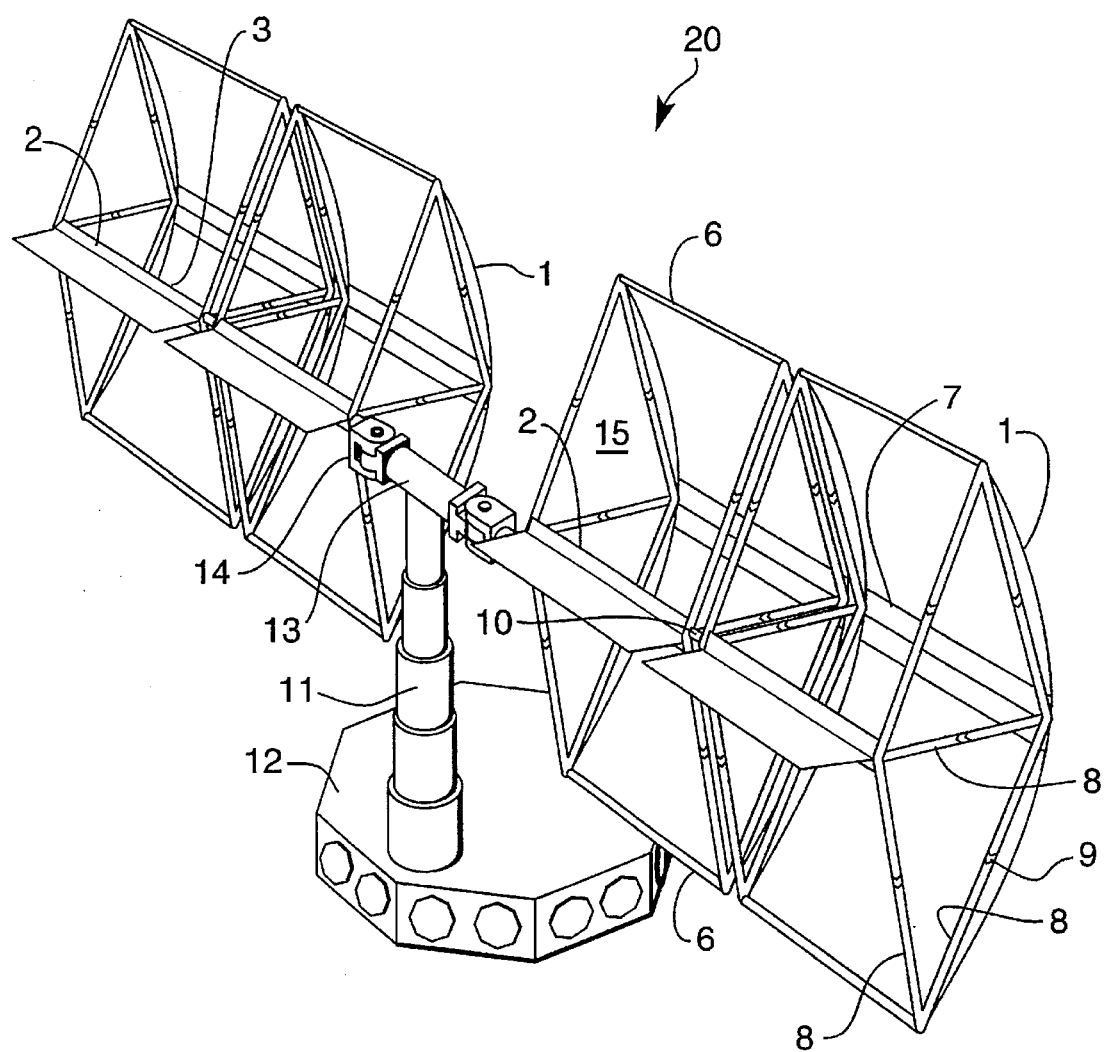
FIG. 2 shows a perspective view of the photovoltaic concentrator after deployment.

The photovoltaic concentrator 20 has a base 12, to which is attached a telescopic mast 11 which pivots on the base 12, and serves as the alpha axis. Mast 11, in this embodiment, is telescopically extendible as shown in FIG. 2. Rod 13 is pivotally connected to mast 11 and serves as the beta axis. Motors or actuators, not shown, can pivot the alpha and beta axes for pointing the concentrator 1 toward the sun for maximum production of electricity.

Deployment hinges 14 are connected to the rod 13 and are able to rotate 90 degrees so that heat pipes 2 are aligned with rod 13.

Foldable struts 8 and hinge joints 9 and 10 are shown stowed in FIG. 1 and deployed in FIG. 2. The unfolding of the structure can be accomplished manually, or with motors, or in the case of unmanned space missions, preferably with spring loaded joints. Spring loading is a common practice in satellites and the spring loading mechanisms have been omitted from the figures for clarity. Spring loading is well known in the art and is therefore not shown here. Spring loading the joints 9 also provides for damping the joints 9 once deployed.

In FIG. 2 the deployed photovoltaic concentrator 20 is shown with foldable struts 8 extended forming triangular frame sections 15. End arms 6 are connected at the top and bottom of the triangular frame sections 15 and are used to attach a reflective concentrator 1 to the structure. The concentrator 1 can be a reflective surface made of any material but in the embodiment shown it is preferred to use an inflatable concentrator 1 made out of silvered Kapton film or similar materials. These materials have the advantage of being light weight and can be folded or rolled for easy storage during predeployment. Inflatable concentrators are also preferred for ease of deployment in space applications. Inflating concentrator 1 will form it to the required shape for reflecting light to the solar cells 3.

The concentrator 1 can also be made from rigid materials such as shaped honey comb, plastics, or glass for space or for terrestrial uses. These materials will retain their shape better and be less susceptible to wind, rain, snow, ice, gravity, and other forces which would deform an inflatable concentrator. These materials can also be used in space for when docking, space vehicle plume loads or other forces are expected, but the concentrator will weigh more and will be less easily deployed.

The central arms 7 are attached to the triangular frame sections 15 and secure a first side of the concentrator 1. End arms 6 secure a second end of concentrator 1. In embodiments with inflatable concentrators 1, the central arm 7 has a gas supply inside of it which is used to initially inflate the photovoltaic concentrator 1 and keep it inflated thereafter.

Figure 3:
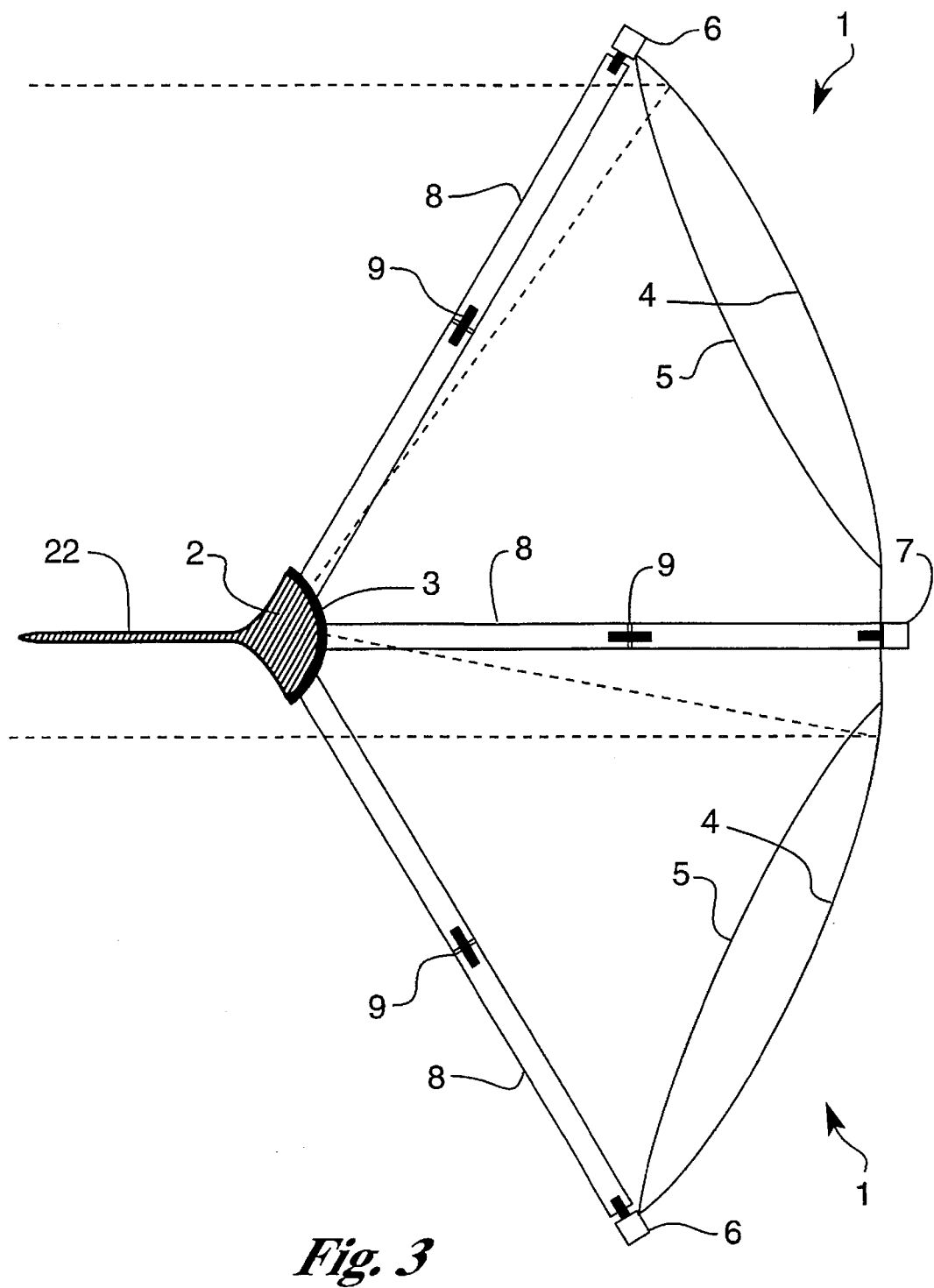
FIG. 3 shows a cross section of the inflatable photovoltaic concentrator of FIG. 2.
Figure 4:
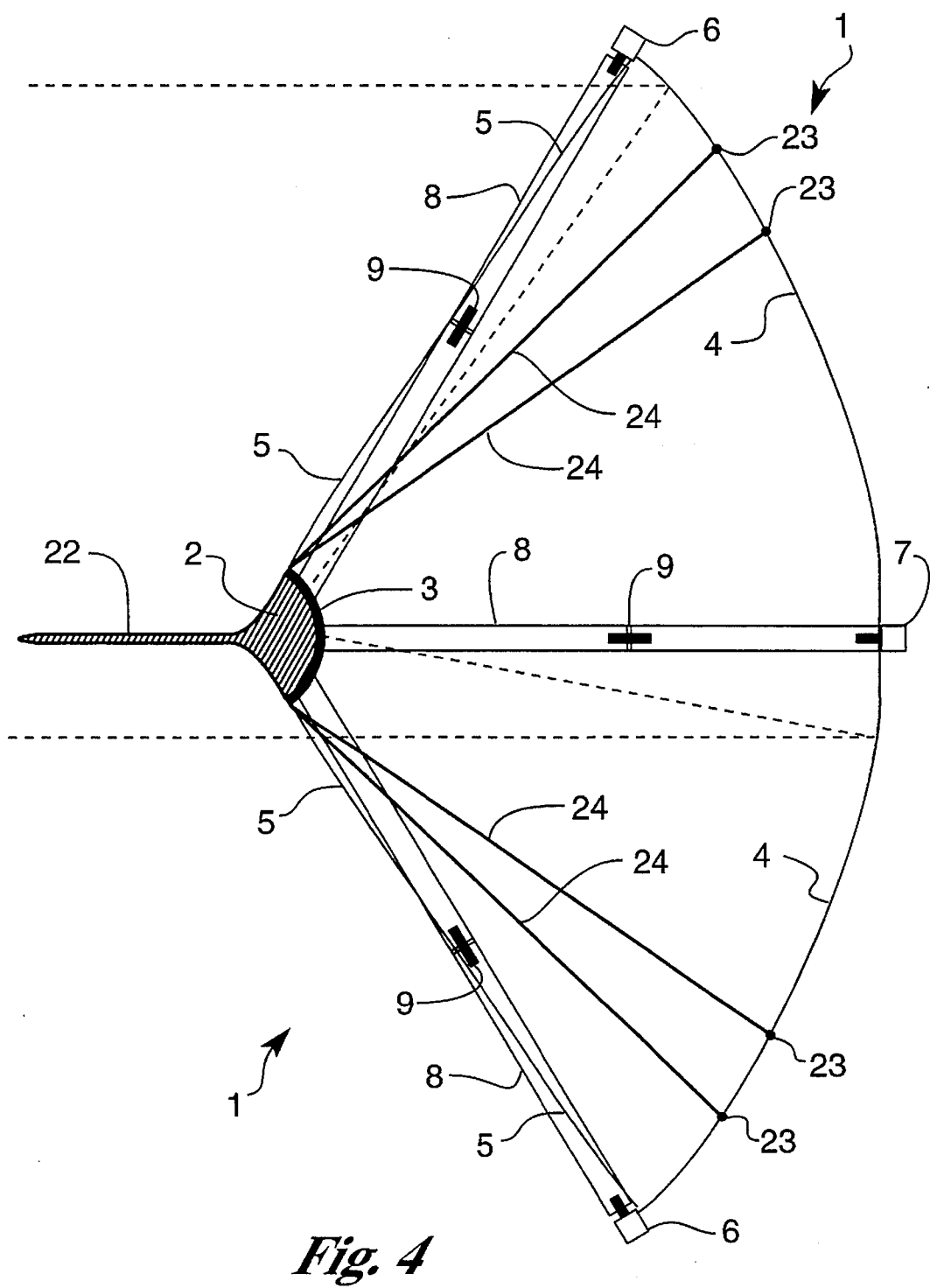
FIG. 4 shows a cross section of an inflatable photovoltaic concentrator having a second embodiment with a transparent surface enclosing the heat pipe.

In FIG. 3 the inflatable concentrator 1 has a transparent film surface 5 and a silvered film reflective surface 4 such that sunlight, shown by dashed lines, passes through the transparent film surface 5, reflects from the reflective surface 4, passes through transparent film surface 5 again and is focused on solar cells 3. Another option, shown in FIG. 4, is to attach the transparent surface 5 to the heat pipe 2. The light passes through the transparent surface 5 and is reflected from the reflective surface 4 directly to the solar cells 3, thus eliminating a second pass of light through transparent surface 5. FIG. 4 shows the form arms 23 and the form arm lines 24 connected between the heat pipe 2 and form arms 23. When concentrator 1 is inflated the arm lines limit the expansion of the concentrator helping to maintain the desired shape for reflecting light accurately.

For use in space the inflation is at a very low pressure of approximately 0.0001 atm. When holes are made in the inflatable photovoltaic concentrator 1, such as by micrometeors, the gas inside escapes very slowly due to the low pressure in space and is replenished by reserve gas supply in arm 7. Various means of detecting the pressure in the concentrator may be used. Increasing or decreasing the pressure until the light is focused to maximum efficiency can be measured by the output of the solar cells.

Sunlight is focused by the concentrator 1 to solar cells 3 on the leading edge of heat pipe 2. The heat pipe 2 is attached to rod 13 and supports the struts 8. As shown in FIGS. 3 and 4, heat pipe 2 has fin 22 for radiating excess heat from the heat pipe. It should be understood that many heat pipe designs may be used with the invention.

In the embodiment of FIG. 3 the solar energy is focused at a ratio of 20 to 1 on a strip of gallium arsenide solar cells 3. The intensity of the concentrated sunlight will raise the temperature of the gallium arsenide solar cells 3 to the annealing point, thereby preventing radiation induced decay over time. It is important not to overheat the solar cells 3 because the electrical connections and bonding material used to attach the cells to the heat pipe 2 would be damaged. The heat pipe 2 limits the temperature of the solar cells by conducting the heat from the back of the solar cells to the radiating fin area 22 of the heat pipe. Heat is radiated at right angles to the incoming solar ray direction. The heat pipe also serves as the structural back bone of the system, since all struts connect to the heat pipe. Heat input to the solar cells is reduced by an infrared reflective shield between the cells and sun that limits the amount of infrared energy absorbed and therefore reduces the size of the heat pipe fin area 22.

The solar cells in this embodiment are gallium arsenide for use in space. The gallium arsenide solar cells were selected because they can operate in a concentrated mode, at high temperatures, and maintain relatively high efficiency. It should be understood that other choices for solar cell material can be made while practicing the invention.

The design as shown is insensitive to pointing inaccuracy. Errors on the alpha axis only affect the thin edge to the solar cell plane, which results in little power loss. On the beta axis, an area larger than that covered by solar cells is supplied with concentrated sun light. This insures that the entire surface of the solar cell area is receiving concentrated sunlight for maximum production of electricity, even when the concentrator is not positioned accurately.

For photovoltaic concentrators in lower orbits or in other applications like the Space Station where there are plume loads to contend with, it is desirable to have a stiffer concentrator 1.

The inflatable concentrator can be stiffened by putting gelatin on the back of the reflective surface 4. When the water is driven out of the gelatin by the sun's radiation the reflective surface 4 dries and becomes stiff, thereby holding its shape. In another embodiment, chemicals which catalyze on exposure to ultraviolet light can be used on the rear of the reflective surface 4 to stiffen it after it is deployed and inflated. Bispenol A acrylate and other chemicals which catalyze when exposed to gases on inflation can also be used to stiffen the concentrator 1.

For terrestrial use a non-inflatable solar concentrator having greater stiffness may be used when weight and ease of deployment are not such important factors.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. A photovoltaic concentrator comprising:

an elongated heat pipe having two heat radiating surfaces and two elongated opposed ends, at least one solar cell having a radiation receiving surface and a back surface, with the back surface attached to one said elongated end of the heat pipe such that the heat pipe radiating surfaces are perpendicular to the solar cell's radiation receiving surface, at least one strut attached to the heat pipe, at least one arm attached to the at least one strut, a light concentrator attached to at least one arm, such that the light concentrator when pointed toward the sun reflects light onto at least one radiation receiving surface of the solar cell with the incident light on the light concentrator being parallel to the heat pipe radiating surfaces.

2. A photovoltaic concentrator as in claim 1 wherein, the light concentrator is an inflatable concentrator.

3. A photovoltaic concentrator as in claim 2 comprising, a source of gas for inflating the inflatable concentrator connected to the inflatable concentrator for adding a gas thereto.

4. A photovoltaic concentrator as in claim 3 comprising, the source of gas is stored in one of said at least one arms.

5. A photovoltaic concentrator as in claim 3 comprising, a means for detecting the pressure in the inflatable light concentrator.

6. A photovoltaic concentrator as in claim 2 comprising, a means for adding gas to the inflatable concentrator to maintain its pressure.

7. A photovoltaic concentrator as in claim 2 comprising, a means of making the inflatable concentrator more rigid after deployment is employed.

8. A photovoltaic concentrator as in claim 2 wherein, the inflatable concentrator has a transparent surface and a reflective surface with a gas therebetween.

9. A photovoltaic concentrator as in claim 1 wherein, an infrared protective coating is provided to reflect infrared radiation and prevent overheating of the solar cells.

10. A photovoltaic concentrator as in claim 1 wherein, the concentrator is a rigid concentrator.

\* \* \* \* \*